United States Patent
Appelt et al.

(10) Patent No.: US 7,172,926 B2
(45) Date of Patent: Feb. 6, 2007

(54) METHOD FOR MANUFACTURING AN ADHESIVE SUBSTRATE WITH A DIE-CAVITY SIDEWALL

(75) Inventors: Bernd Karl Appelt, Kaohsiung (TW); Ching-Hua Tsao, Yunghe (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 206 days.

(21) Appl. No.: 10/828,248

(22) Filed: Apr. 21, 2004

(65) Prior Publication Data

US 2005/0239235 A1 Oct. 27, 2005

(51) Int. Cl.
H01L 21/44 (2006.01)
H01L 21/48 (2006.01)
H01L 21/50 (2006.01)

(52) U.S. Cl. .......... 438/121; 257/E21.5; 257/E21.505; 257/E21.51

(58) Field of Classification Search .......... 438/121
See application file for complete search history.

(56) References Cited

U.S. PATENT DOCUMENTS

| | | | | |
|---|---|---|---|---|
| 3,775,844 A | * | 12/1973 | Parks | 29/830 |
| 3,813,773 A | * | 6/1974 | Parks | 29/830 |
| 5,357,672 A | * | 10/1994 | Newman | 29/830 |
| 5,926,696 A | * | 7/1999 | Baxter et al. | 438/118 |
| 6,195,264 B1 | * | 2/2001 | Lauffer et al. | 361/762 |
| 6,475,327 B2 | * | 11/2002 | Tung et al. | 156/306.6 |
| 6,501,168 B1 | | 12/2002 | Castro et al. | 257/700 |
| 6,506,626 B1 | | 1/2003 | Chiu | 438/108 |
| 6,566,166 B2 | * | 5/2003 | Chien | 438/108 |
| 6,639,304 B1 | | 10/2003 | Oggioni et al. | 257/660 |
| 2001/0046725 A1 | | 11/2001 | Ho | 438/121 |

\* cited by examiner

*Primary Examiner*—David A Zarneke
(74) *Attorney, Agent, or Firm*—Troxell Law Office, PLLC

(57) ABSTRACT

A method for manufacturing an adhesive substrate with a die-cavity sidewall is disclosed. A region for forming die-cavity sidewall is defined on one surface of the substrate. The substrate is laminated with a sacrificial film, a partially cured resin is formed between the substrate and the sacrificial film. And then, an aperture is routed through the substrate, the partially cured resin, and the sacrificial film. The aperture is located corresponding to the region so that the substrate has a die-cavity sidewall formed inside the aperture. Thereafter, the sacrificial film is removed to expose the partially cured resin on the substrate so that the substrate with a die-cavity sidewall can have good adhesion.

27 Claims, 6 Drawing Sheets

METHOD FOR MANUFACTURING AN ADHESIVE SUBSTRATE WITH A DIE-CAVITY SIDEWALL

FIELD OF THE INVENTION

The present invention relates to a method for manufacturing a substrate assembly with a die cavity to accommodate a semiconductor chip and, more particularly, to a method for manufacturing an adhesive substrate with a die-cavity sidewall.

BACKGROUND OF THE INVENTION

In the field of semiconductor packages and modules, a substrate with a die cavity to accommodate a semiconductor chip is rather common. The die cavity comprises a die-cavity sidewall and a die-attached plane. For controlling the height of the die-cavity sidewall and the coplanality of the die-attached plane, the die-cavity sidewall and the die-attached plane are manufactured from two different substrates firstly, then by using an adhesive layer to laminate the substrate with a die-cavity sidewall and the substrate with a die-attached plane for forming a laminated substrate assembly with a die cavity. As disclosed in U.S. Pat. No. 6,506,626 and U.S. Patent Application Publication No. 2001/0046725, the substrate with a die-attached plane is a ball grid array circuit board and the substrate with a die-cavity sidewall is a metal stiffener or spacer circuit board, both substrates are assembled to be a substrate assembly with a die cavity for manufacturing a semiconductor package or module with a faceup die cavity. As disclosed in U.S. Pat. No. 6,639,304 and U.S. Pat. No. 6,501,168, the substrate with a die-attached plane is a metal plate or metal core. Moreover, the substrate with a die-cavity sidewall is a circuit board with an opening or window. Both substrates are assembled for manufacturing semiconductor package or module with facedown die cavity.

Normally the adhesive layer used for laminating the two substrates mentioned above is acrylate film, liquid adhesive or prepreg. When the adhesive layer is a solid type or gummy type film such as acrylate film or prepreg, it is necessary to punch or route an opening, then two substrates are laminated under the opening of the adhesive layer aligned to the die-attached plane of the substrate. However, due to the nature of the adhesive layer, the adhesive layer will stick to the tooling or attract unwanted particles during processes, which caused extra cleaning problem for tooling and degradation of adhesion. Moreover, the arcylate film is very sensitive to moisture and only can reach JEDEC lever four. During the routing or punching processes, prepreg can be easily damaged and formed lots of resin flakes or particles.

When using liquid adhesive as an adhesive layer for bonding the two substrates mentioned above, as well known, the liquid adhesive needs to apply to the substrate with a die-cavity sidewall or to the substrate with a die-attached plane via screen printing. In order to avoid the contamination of liquid adhesive onto the die-cavity sidewall during laminating the substrates, the liquid adhesive must have higher adhesion with proper surface tension and viscosity. If the liquid adhesive contains solvent, after screen printing, the liquid adhesive layer will need pre-bake or drying processes and then the two substrates mentioned above are laminated and cured under higher temperatures. During the curing processes, the curing conditions need extremely under control, any mistakes may force the liquid adhesive layer to flow to the die-cavity sidewall or die-attached plane and cause the coplanality issue for die attachment.

A method for manufacturing die cavity on a substrate is disclosed in U.S. Pat. No. 6,195,264. An adhesive layer with photosensitive material can be applied between the metal stiffener and printed circuit board. A substrate assembly with a die cavity will be formed after lamination since the adhesive layer with photosensitive material can be exposed and developed, therefore, no residual of the adhesive layer can be found inside the die cavity. However, the requirements for the adhesive layer with photosensitive material should have an excellent photosensitivity and easy photo processing characteristics, moreover, good thermal-setting properties, adhesion, and heat conductivity. However, such kind of adhesive layer with photosensitive material is not easy to get which is in higher cost.

SUMMARY OF THE INVENTION

A main purpose of the present invention is to supply a method for manufacturing an adhesive substrate with a die-cavity sidewall. A substrate and a sacrificial film are laminated together with a partially cured resin in-betweens. Then an aperture is routed through the substrate, the partially cured resin, and the sacrificial film, then, a die-cavity sidewall from the substrate is formed inside the aperture. Then by removing the sacrificial film, the partially cured resin will be kept on the substrate, moreover, the partially cured resin will not contaminate the die-cavity sidewall, at the same time, the substrate will have good adhesion for laminating with the other substrate.

According to the present invention, a method for manufacturing an adhesive substrate with a die-cavity sidewall includes, firstly, providing a substrate with an attaching surface. At least a region for forming a die-cavity sidewall is defined on the attaching surface of the substrate. Next, the substrate is laminated with a sacrificial film with a partially cured resin in-betweens. An aperture is created corresponding to the region and passes through the substrate, the partially cured resin, and the sacrificial film by routing or punching, therefore, a die-cavity sidewall will be formed in the substrate. The aperture can be formed by routing, punching or the other method. Thereafter, by removing the sacrificial film, the partially cured resin is exposed on the substrate. Therefore, the adhesive substrate with a die-cavity sidewall can be laminated with another substrate with a die-attached plane to be a laminated substrate assembly with a die cavity that can be manufacturing with low cost and implemented in either facedown or faceup semiconductor packages or modules.

DETAIL DESCRIPTION OF THE INVENTION

Figure 1A:
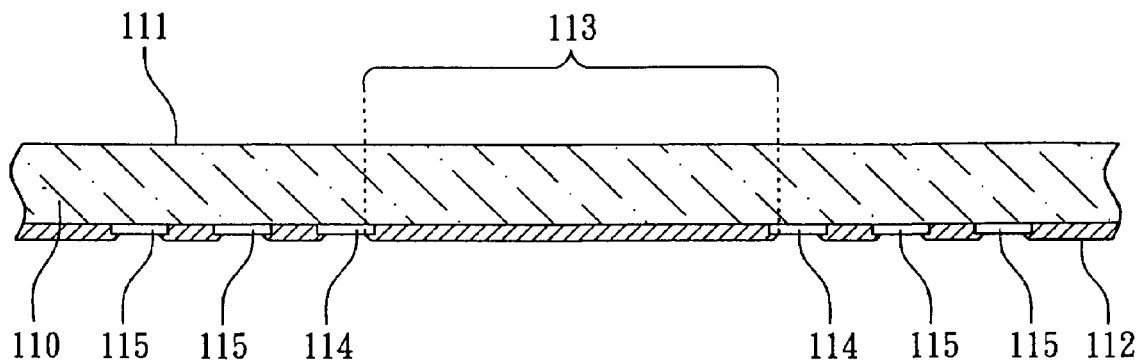
FIG. 1A to FIG. 1D are cross-sectional views of an adhesive substrate with a die-cavity sidewall during manufacturing process in accordance with the first embodiment of the present invention.
Figure 4:
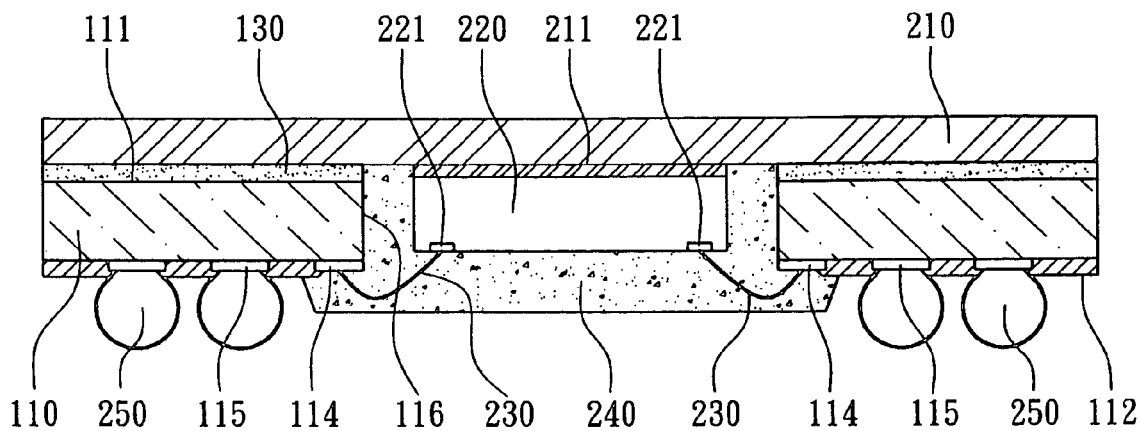
FIG. 4 is a cross-sectional view of a semiconductor package comprising the adhesive substrate with a die-cavity sidewall manufactured in accordance with the first embodiment of the present invention.

Please refer to the drawings attached, the present invention will be described by means of embodiments below. According to the present invention, the first embodiment discloses a method for manufacturing an adhesive substrate with a die N cavity sidewall. As shown in FIG. 1A, firstly the first substrate 110 is provided. The first substrate 110 has the first surface 111 and the second surface 112. In this embodiment, the first substrate 110 is a ball grid array (BGA) substrate for semiconductor package or module with face-down die cavity. Normally, the first substrate 110 is a printed circuit board made of BT resin. The first surface 111 is used to attach to the second substrate 210, is shown in FIG. 4. The first surface 111 defines at least one region 113 for forming a die-cavity sidewall. The second surface 112 has a plurality of bonding fingers 114 for bonding wires and a plurality of ball pads 115 for solder balls.

Figure 1B:
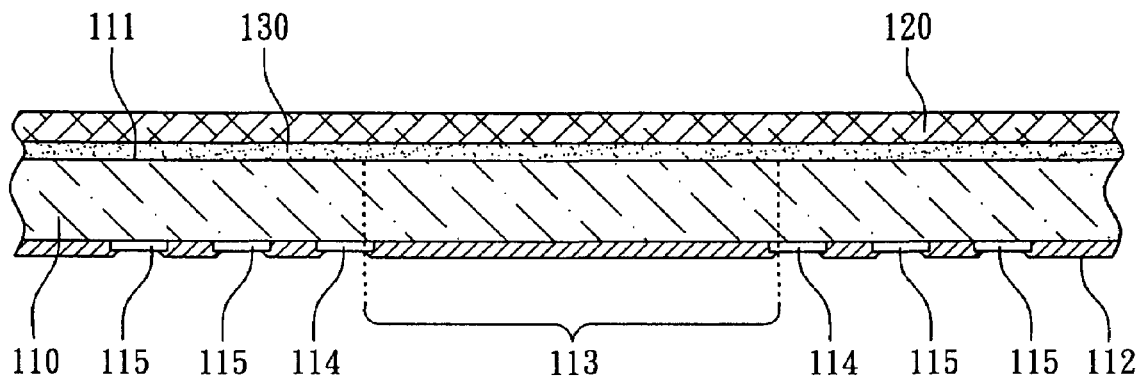

Then, as shown in FIG. 1B, the first substrate 110 is laminated with a sacrificial film 120. The sacrificial film 120 may be a low cost, etchable metal film, such as copper foil. Moreover, a partially cured resin 130 is formed between the first substrate 110 and the sacrificial film 120 to form a laminated substrate. The partially cured resin 130 is cured from 5 to 50%, and more preferably, the partially cured resin 130 is cured 5 to 15%. After laminating the first substrate 110 with the sacrificial film 120, the partially cured resin 130 is pressed via the sacrifiical film 120 to have an uniform thickness. Therefore, the formation of unwanted particles during processes and the contamination of the partially cured resin 130 will be greatly reduced. Moreover, the partially cured resin 130 can be easily processing and will not stick to the tooling. The partially cured resin 130 has multi-stage thermosetting property, which can be partially cured (in B-stage) under proper curing temperature and conditions. The partially cured resin 130 can be made of epoxy resin, BT (Bismaleimide Triazine) resi or PI (Polyimide) resin. The partially cured resin 130 can be prepreg containing glass fibers, preferably, the partially cured resin 130 contains metal particles, such as silver particles to enhance heat conductivity of the partially cured resin 130.

Figure 1C:
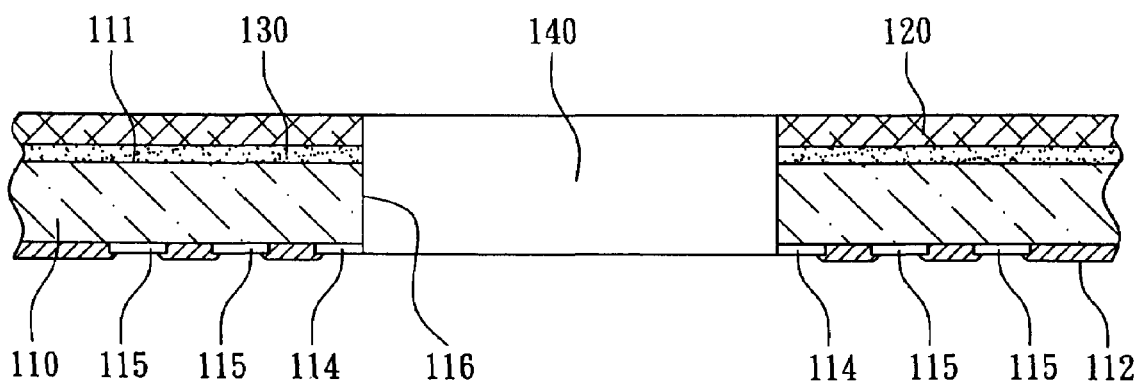
Figure 2:
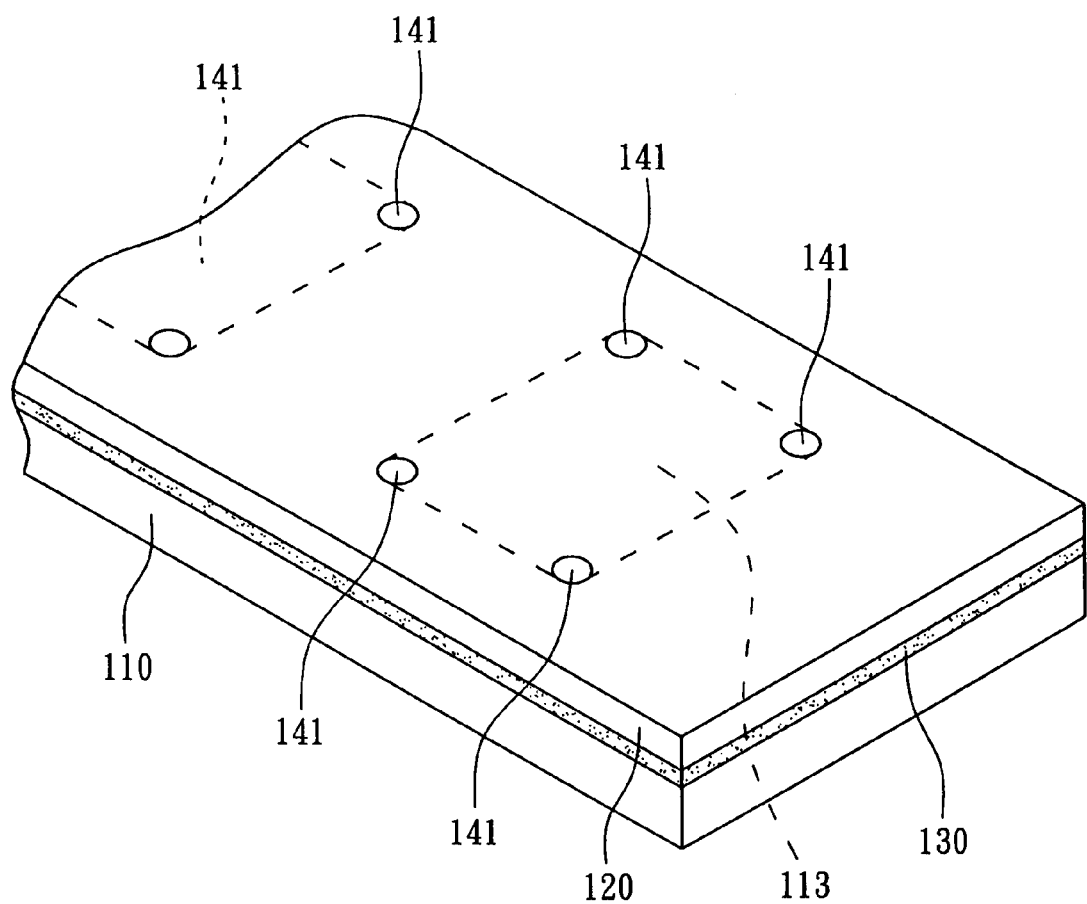
FIG. 2 is a three-dimensional view of a substrate forming with pre-cutting holes after lamination in accordance with the first embodiment of the present invention.
Figure 3:
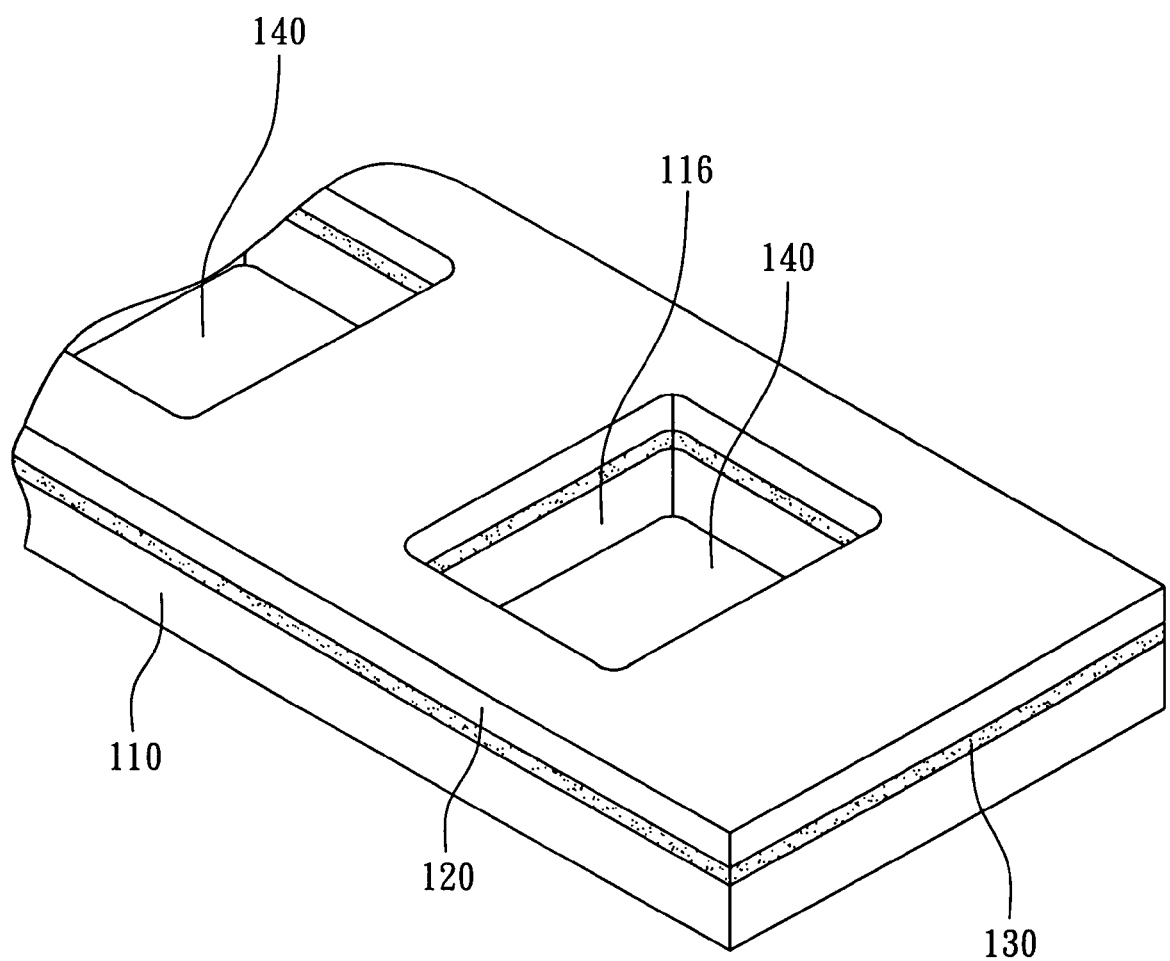
FIG. 3 is a three-dimensional view of a substrate forming with apertures after lamination in accordance with the first embodiment of the present invention.

Thereafter, as shown in FIG. 1C and FIG. 3, using routing or other through hole forming methods, an aperture 140 is formed through the laminated substrate which is made of the first substrate 110, the sacrificial film 120, and the partially cured resin 130. Referring to FIG. 2, before routing the aperture 140, at least one pre-cutting hole 141 can be formed at periphery of the region 113. The pre-cutting hole 141 was routed through the first substrate 110, the partially cured resin 130, and the sacrificial film 120. Preferably, the pre-cutting holes 141 are located at the corners of the region 113. Next, the aperture 140 is formed by a routing machine, which is located corresponding to the region 113 of the substrate 110. The aperture 140 is routed through the first substrate 110, the partially cured resin 130, and the sacrificial film 120 so that the first substrate 110 has a die-cavity sidewall 116 which is inside the aperture 140.

Figure 1D:
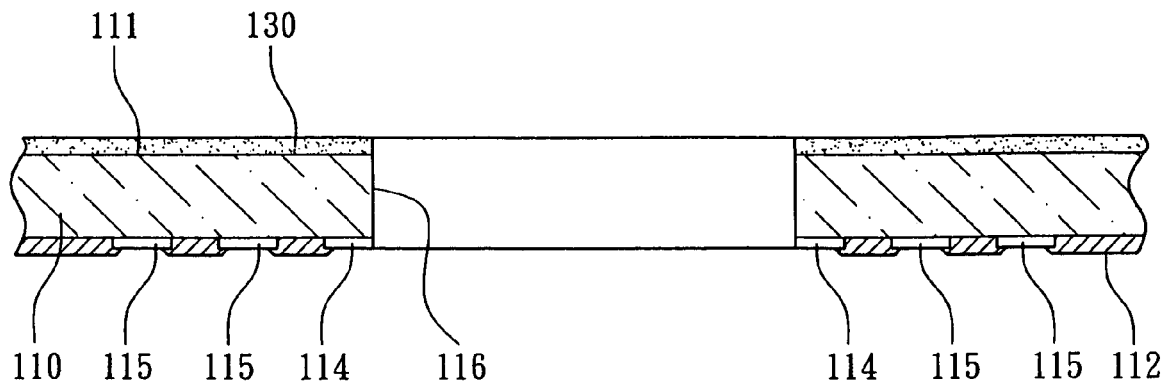

Thereafter, as shown in FIG. 1D, the sacrificial film 120 is removed to make the partially cured resin 130 appear on the first surface 111 of the first substrate 110. The sacrificial film 120 can be removed by etching or peeling methods. Moreover, the partially cured resin 130 is formed prior to making the aperture 140, therefore, the die-cavity sidewall 116 will not be contaminated by the partially cured resin 130. Besides, the partially cured resin 130 with good adhesion is applied on the first surface 111 of the first substrate 110 by printing or the other, which is ready for laminating a substrate with a die-attached plane.

The first substrate 110 with the die-cavity sidewalls 116 is laminated with a second substrate 210 with a die-attached plane 211 to be a substrate assembly with a die cavity which can be used to assembly a cavity-down semiconductor package or module. As shown in FIG. 4, the cavity-down semiconductor package comprises the first substrate 110. The partially cured resin 130 is formed on the first surface 111 of the first substrate 110 to adhere the second substrate 210 with a die-attached plane 211. After laminating the first substrate 110 with the second substrate 210, the die-cavity sidewall 116 of the first substrate 110 and the die-attached plane 211 of the second substrate 210 constitute a die cavity for accommodating a semiconductor chip 220. During the lamination of the first substrate 110 and the second substrate 210, the partially cured resin 130 will not overflow to contaminate the die-cavity sidewall 116 or the die-attached plane 211. Therefore, there is no alignment problem for adhesive layers.

In this embodiment, the second substrate 210 with the die-attached plane 211 is a metal heat spreader. The semiconductor chip 220 is attached to the die-attached plane 211 of the second substrate 210. Moreover, the chip 220 is inside the die-cavity sidewall 116 of the first substrate 110, i.e., the semiconductor chip 220 is accommodated inside the die cavity formed by the die-cavity sidewall 116 and the die-attached plane 211. A plurality of bonding wires 230 are used to electrically connect a plurality of bonding pads 221 of the semiconductor chip 220 with the bonding fingers 114 of the first substrate 110. Thereafter, a package body 240 is formed inside the die cavity formed by the die-cavity sidewall 116 and the die-attached plane 211. A plurality of solder balls 250 are bonded on the ball pads 115. Finally, a semiconductor package with facedown die cavity is assembled.

Figure 5A:
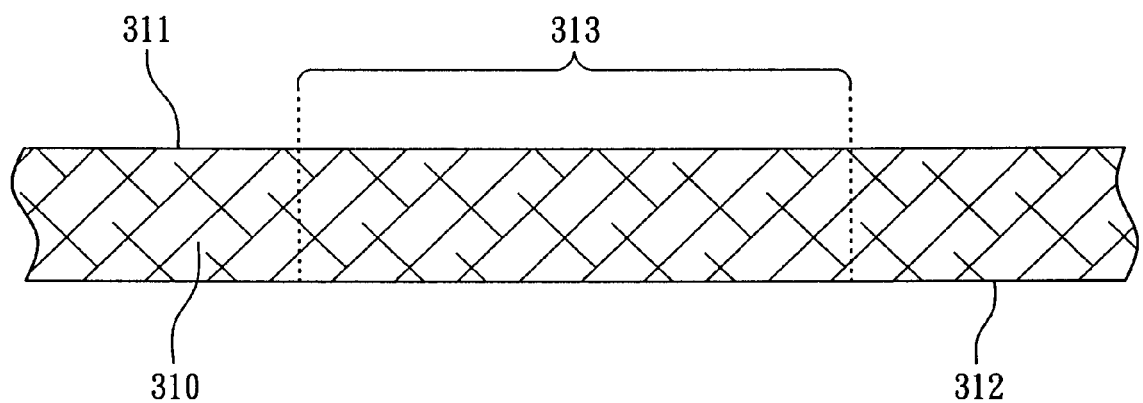
FIG. 5A to FIG. 5D are cross-sectional views of an adhesive substrate with a die-cavity sidewall during the manufacturing process in accordance with the second embodiment of the present invention.
Figure 5B:
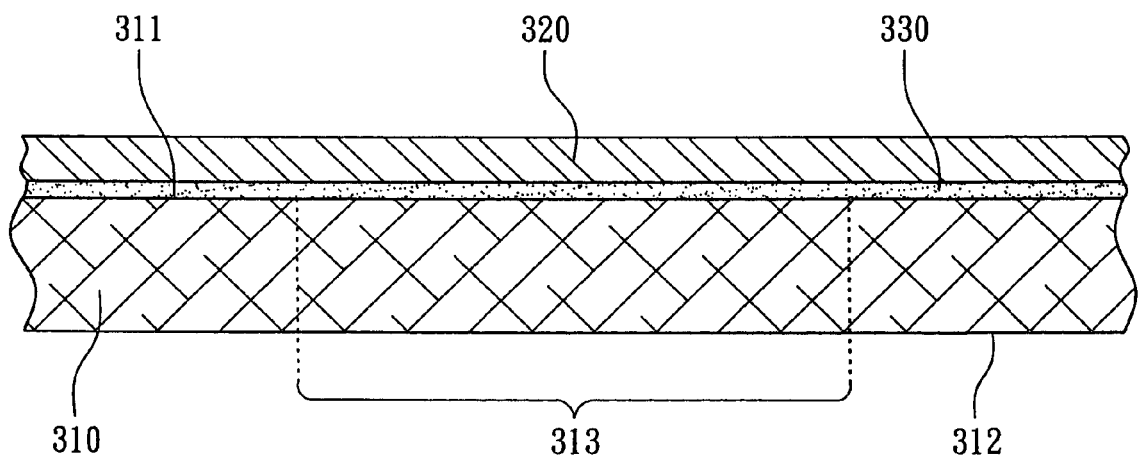

Furthermore, in the present invention, the method of manufacturing an adhesive substrate with a die-cavity sidewall can be implemented to assemble a laminated substrate with a faceup die cavity. According to the second embodiment of the present invention, as shown in FIG. 5A, the first substrate 310 is provided firstly. The first substrate 310 has a first surface 311 and a second surface 312. In this embodiment, the first substrate 310 is a metal plate used as a stiffener for semiconductor packages or modules. There is at least one region 313 for forming a die-cavity sidewall on the first surface 311. Thereafter, as shown in FIG. 5B, the first substrate 310 is laminated with a sacrificial film 320. Moreover, a partially cured resin 330 is formed between the first substrate 310 and the sacrificial film 320 so as to form a laminated substrate. The surface of the sacrificial film 320 that contacts the partially cured resin 330 is a smooth surface for easy peeling. The sacrificial film 320 may be a paper carrier or metal foil.

Figure 5C:
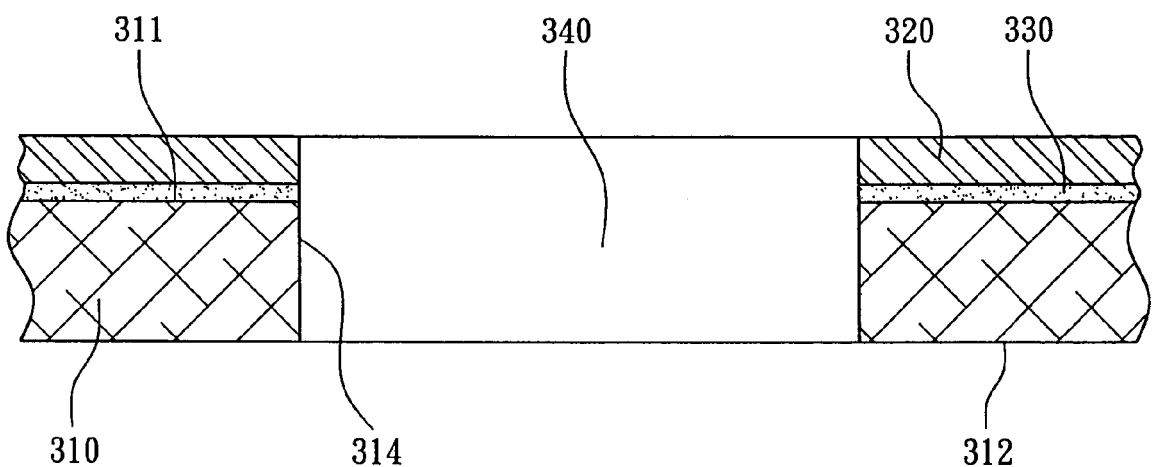
Figure 5D:
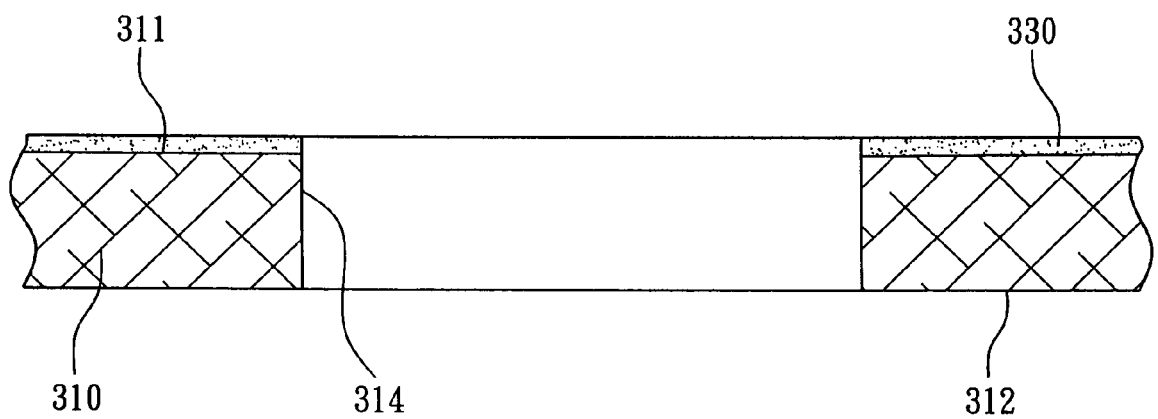

Then, as shown in FIG. 5C, the region 313 is punched off to form an aperture 340 through the laminated substrate including the first substrate 310, the sacrificial film 320, and the partially cured resin 330. Therefore, a die-cavity sidewall 314 from the first substrate 310 is formed inside the aperture 340. Thereafter, as shown in FIG. 5D, the sacrificial film 320 is removed by the method of peeling or etching so that the partially cured resin 330 on the first surface 311 of the first substrate 310 will be exposed.

Figure 6:
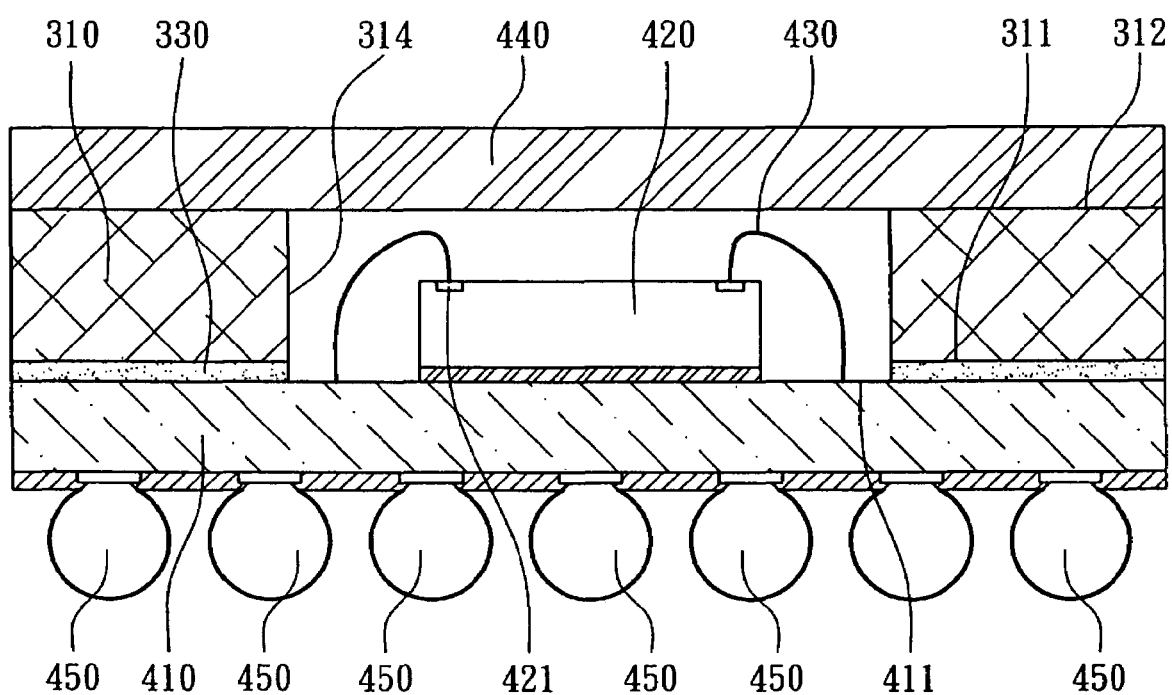
FIG. 6 is a cross-sectional view of a semiconductor package comprising the adhesive substrate with a die-cavity sidewall manufactured in accordance with the second embodiment of the present invention.

Therefore, the first substrate 310 with the die-cavity sidewall 314, i.e., an adhesive stiffener, formed by the method mentioned above is adhesive because that the partially cured resin 330 is formed on the first substrate 310. The first substrate 310 with the die-cavity sidewall 314 can be implemented on a semiconductor package or module with a faceup die cavity, is shown in FIG. 6. A semiconductor package comprises the first substrate 310. The partially cured resin 330 is formed on the first surface 311 of the first substrate 310 to adhere the second substrate 410, such as a printed circuit board, which has a die-attached plane 411. A die cavity consists of the die-attached plane 411 and the die-cavity sidewall 314 so as to accommodate a semiconductor chip 420. Normally, after laminating the first substrate 310 with the second substrate 410, the partially cured resin 330 can be completely cured. The semiconductor chip 420 is attached to the die-attached plane 411 of the second substrate 410 and is positioned inside the die-cavity sidewall 314 of the first substrate 310. A plurality of bonding wires 430 are used to electrically connect the bonding pads 421 of the semiconductor chip 420 with the second substrate 410. Preferably, a heat spreader 440 can be adhered to the second surface 312 of the first substrate 310. Then a plurality of solder balls 450 are bonded on the second substrate 410. Finally, a semiconductor package or module with faceup cavity is assembled.

The above description of embodiments of this invention is intended to be illustrative and not limiting. Other embodiments of this invention will be obvious to those skilled in the art in view of the above disclosure.

What is claimed is:

1. A method for manufacturing an adhesive substrate with a die-cavity sidewall, comprising:
   providing a first substrate, the first substrate having a surface defining at least a region for forming the die-cavity sidewall;
   laminating the first substrate with a sacrificial film, a partially cured resin being formed between the first substrate and the sacrificial film;
   forming an aperture located corresponding to the region of the first substrate, the aperture passing through the first substrate, the partially cured resin and the sacrificial film in a manner that the first substrate has the die-cavity sidewall inside the aperture; and
   removing the sacrificial film to expose the partially cured resin on the first substrate.

2. The method of claim 1, wherein the partially cured resin is cured from 5 to 50%.

3. The method of claim 1, wherein the partially cured resin has an uniform thickness.

4. The method of claim 1, wherein the partially cured resin is a prepreg.

5. The method of claim 1, wherein the partially cured resin is selected from one of the group of epoxy resin, BT(Bismaleimide Triazine) resin, or PI (Polyimide) resin.

6. The method of claim 1, wherein the partially cured resin contains metal particles.

7. The method of claim 1, wherein the sacrificial film is removed by peeling.

8. The method of claim 1, wherein the sacrificial film is removed by etching.

9. The method of claim 1, wherein the sacrificial film is a metal foil.

10. The method of claim 1, wherein the aperture is formed by punching.

11. The method of claim 1, wherein the aperture is formed by routing.

12. The method of claim 11, further comprising: forming a pre-cutting hole through the first substrate, the partially cured resin and the sacrificial film for routing the aperture.

13. The method of claim 12, wherein the pre-cutting hole is located at the corner of the region of the first substrate.

14. The method of claim 1, wherein the first substrate is a stiffener.

15. The method of claim 14, wherein the first substrate is a metal plate.

16. The method of claim 1, further comprising: adhering the partially cured resin on the first substrate to a second substrate with a die-attached plane to form a die cavity.

17. A method for manufacturing a semiconductor device, comprising:
   providing a first substrate, the first substrate having a surface defining at least a region for forming a die-cavity sidewall;
   laminating the first substrate with a sacrificial film, a partially cured resin being formed between the first substrate and the sacrificial film;
   forming an aperture located corresponding to the region, the aperture passing through the substrate, the partially cured resin and the sacrificial film in a manner that the first substrate has a die-cavity sidewall inside the aperture;
   removing the sacrificial film to expose the partially cured resin on the substrate;
   adhering the partially cured resin on the first substrate to a second substrate with a die-attached plane to form a die cavity;
   attaching a semiconductor chip to the die-attached plane of the second substrate; and
   electrically connecting the semiconductor chip and the first substrate.

18. The method of claim 17, wherein the partially cured resin is cured from 5 to 50%.

19. The method of claim 17, wherein the partially cured resin has an uniform thickness.

20. The method of claim 17, wherein the partially cured resin is a prepreg.

21. The method of claim 17, wherein the partially cured resin is selected from one of the group of epoxy resin, BT (Bismaleimide Triazine) resin, or PI (Polyimide) resin.

22. The method of claim 17, wherein the partially cured resin contains metal particles.

23. The method of claim 17, wherein the sacrificial film is a metal foil.

24. The method of claim 17, wherein the sacrificial film is removed by peeling or etching.

25. The method of claim 17, wherein the first substrate is a cavity-down ball grid array substrate.

26. The method of claim 25, wherein the second substrate is a heat spreader.

27. The method of claim 17, further comprising: forming a package body inside the die cavity.

* * * * *